US010925392B2

United States Patent
Chen et al.

(10) Patent No.: US 10,925,392 B2
(45) Date of Patent: Feb. 23, 2021

(54) BRACKET MOUNTING STRUCTURE

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Kai-Wen You, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 0 days.

(21) Appl. No.: 16/420,405

(22) Filed: May 23, 2019

(65) Prior Publication Data
US 2020/0187644 A1   Jun. 18, 2020

(30) Foreign Application Priority Data
Dec. 14, 2018   (TW) ................... 10714564.8

(51) Int. Cl.
A47B 57/48      (2006.01)
A47B 88/407     (2017.01)
A47B 57/36      (2006.01)

(52) U.S. Cl.
CPC ............ *A47B 57/485* (2013.01); *A47B 57/36* (2013.01); *A47B 88/407* (2017.01)

(58) Field of Classification Search
CPC ...... H05K 7/1489; H05K 7/183; A47B 88/43; A47B 57/485
USPC ...................................... 248/219.3
See application file for complete search history.

(56) References Cited

U.S. PATENT DOCUMENTS

| 7,357,362 | B2  | 4/2008 | Yang et al. | |
| 7,731,142 | B2* | 6/2010 | Chen ............ | A47B 88/43 |
| | | | | 248/244 |
| 8,146,756 | B2* | 4/2012 | Brock .......... | A47B 96/06 |
| | | | | 211/192 |
| 8,727,138 | B2  | 5/2014 | Dittus et al. | |
| 8,967,567 | B2* | 3/2015 | Chen ............ | H05K 7/1489 |
| | | | | 211/192 |

(Continued)

FOREIGN PATENT DOCUMENTS

| CN | 207485828 U | 6/2018 |
| DE | 202014100424 U1 | 2/2014 |

OTHER PUBLICATIONS

International Search Report Issued by a Foreign Patent Office for No. 19183187.4-1011.

*Primary Examiner* — Bradley Duckworth
(74) *Attorney, Agent, or Firm* — Rosenberg, Klein & Lee (57) ABSTRACT

A bracket mounting structure includes a bracket, a base, a connecting member, an elastic member, and a mounting member. The bracket includes a longitudinal wall. The base is arranged adjacent to the longitudinal wall and includes a first space and a second space. The connecting member is mounted in the first space and includes a first portion, a second portion, and a through hole arranged in the first portion and the second portion. At least one of the first portion and the second portion has a screw thread feature. The elastic member is received in the first space and is configured to apply an elastic force to the connecting member. The mounting member is mounted in the second space.

20 Claims, 8 Drawing Sheets

(56) References Cited

U.S. PATENT DOCUMENTS

| | | | |
|---|---|---|---|
| 9,066,591 B2* | 6/2015 | Chen | A47B 88/43 |
| 9,125,489 B2* | 9/2015 | Chen | A47B 88/43 |
| 10,194,556 B2* | 1/2019 | Chen | A47B 88/423 |
| 10,251,482 B2* | 4/2019 | Chen | A47B 57/487 |
| 10,398,226 B2* | 9/2019 | Chen | H05K 7/1489 |
| 10,595,435 B2* | 3/2020 | Chen | H05K 7/1489 |
| 2019/0246516 A1* | 8/2019 | Hsu | A47B 88/407 |
| 2020/0069054 A1* | 3/2020 | Hsu | A47B 88/43 |

* cited by examiner

BRACKET MOUNTING STRUCTURE

FIELD OF THE INVENTION

The present invention relates to a bracket mounting structure and more particularly to a bracket mounting structure for use with a slide rail.

BACKGROUND OF THE INVENTION

A bracket mounting structure is typically used in a rack system to mount a slide rail assembly on a post of a rack. Chinese Utility Model Patent No. 207485828 U, for example, discloses a retractable floating nut for a slide rail. According to FIG. 1 to FIG. 3 of this Chinese patent, the nut includes a front guide post (4), a polygonal pad (5), a spring seat (6), and a rear guide post (7). The front guide post (4) has an internal thread (3). The polygonal pad (5) is provided behind the front guide post (4), the spring seat (6) is provided behind the polygonal pad (5), and the rear guide post (7) is provided behind the spring seat (6).

Due to the spring seat (6) and the rear guide post (7) behind the polygonal pad (5), the structural configuration of the nut may be too complicated in certain applications, making it difficult for a threaded element of a specific length to extend to the rear side of the polygonal pad (5) through the internal thread (3). The development of a different bracket product, therefore, is an issue worth studying.

SUMMARY OF THE INVENTION

The present invention relates to a bracket mounting structure for use with a slide rail to easily adapt the slide rail to posts of different specifications so that the slide rail can be mounted and locked in place rapidly.

According to one aspect of the present invention, a bracket mounting structure for use with a slide rail includes a bracket, a base, a connecting member, a first elastic member, and a mounting member. The bracket includes a longitudinal wall. The base is disposed adjacent to the longitudinal wall and includes a first space and a second space. The connecting member is mounted in the first space and includes a screw thread feature. The first elastic member is received in the first space and is configured to apply an elastic force to the connecting member. The mounting member is mounted in the second space.

Preferably, the connecting member includes a first portion, a second portion, and a though hole extending through the first portion and the second portion.

Preferably, at least one of the first portion and the second portion includes the screw thread feature in the through hole.

Preferably, the second portion is connected to and larger in size than the first portion.

Preferably, the second portion has a non-circular contour.

Preferably, the first portion and the second portion are columnar.

Preferably, the base includes an auxiliary screw thread feature, and the screw thread feature and the auxiliary screw thread feature are configured to connect with a threaded element.

Preferably, the bracket mounting structure is also for use with a post. More specifically, the connecting member is so positioned as to be mounted to the post at a first position thereof, and the mounting member is configured to be inserted into the post at a second position thereof.

Preferably, the post is a first post with a first mounting hole at the first position and a second mounting hole at the second position. A first threaded element can be passed through the first mounting hole and be threadedly connected to the screw thread feature of the connecting member to lock the bracket to the first post.

Preferably, the post is a second post with a first mounting hole at the first position and a second mounting hole at the second position. A second threaded element can be passed through the first mounting hole and be threadedly connected to at least one of the screw thread feature of the connecting member and the auxiliary screw thread feature of the base to lock the bracket to the second post.

Preferably, the first mounting hole either has a first diameter larger than the first portion of the connecting member so that the first portion of the connecting member can be inserted into the first mounting hole, or has a second diameter smaller than the first portion of the connecting member so that the first portion of the connecting member can be pressed against a wall portion of the second post that surrounds the first mounting hole, thereby retracting the entire connecting member into the first space.

Preferably, the bracket includes an end wall bent with respect to the longitudinal wall, and the base is disposed on the end wall.

Preferably, the end wall is substantially perpendicularly connected to the longitudinal wall.

Preferably, the connecting member extends through the end wall via a first hole of the end wall in response to the elastic force released by the first elastic member.

Preferably, the mounting member includes a first mounting portion and a second mounting portion retractably connected to the first mounting portion, and the second mounting portion has a larger size than the first mounting portion.

Preferably, the first mounting portion and the second mounting portion extend through the end wall via a second hole of the end wall.

Preferably, the bracket mounting structure further includes a fastening member movably mounted on the bracket. When the fastening member is at a predetermined position, a fastening portion of the fastening member is adjacent to the mounting member.

DETAILED DESCRIPTION OF THE INVENTION

Figure 1:
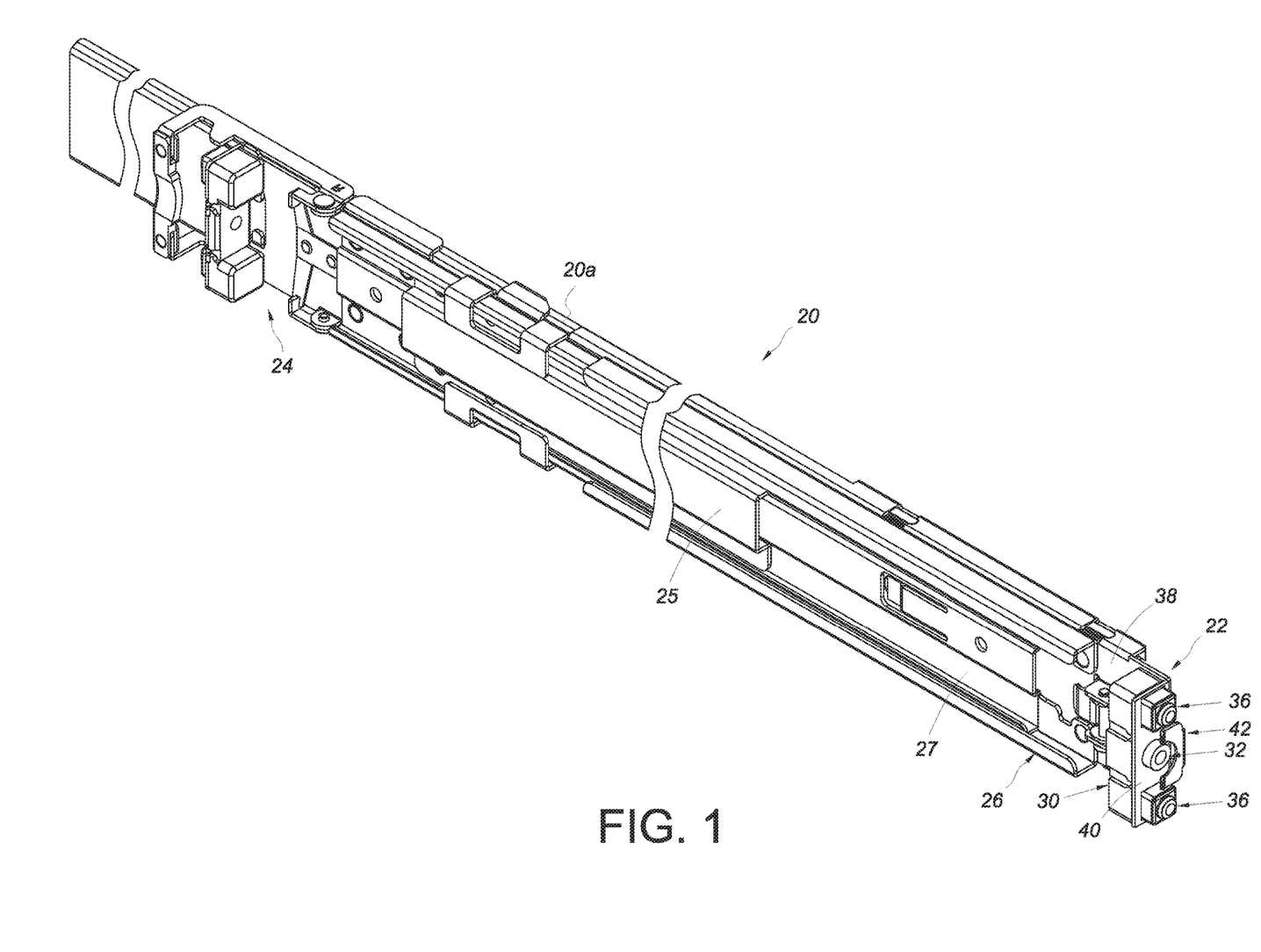
FIG. 1 is a perspective view of a slide rail assembly according to an embodiment of the present invention.
Figure 2:
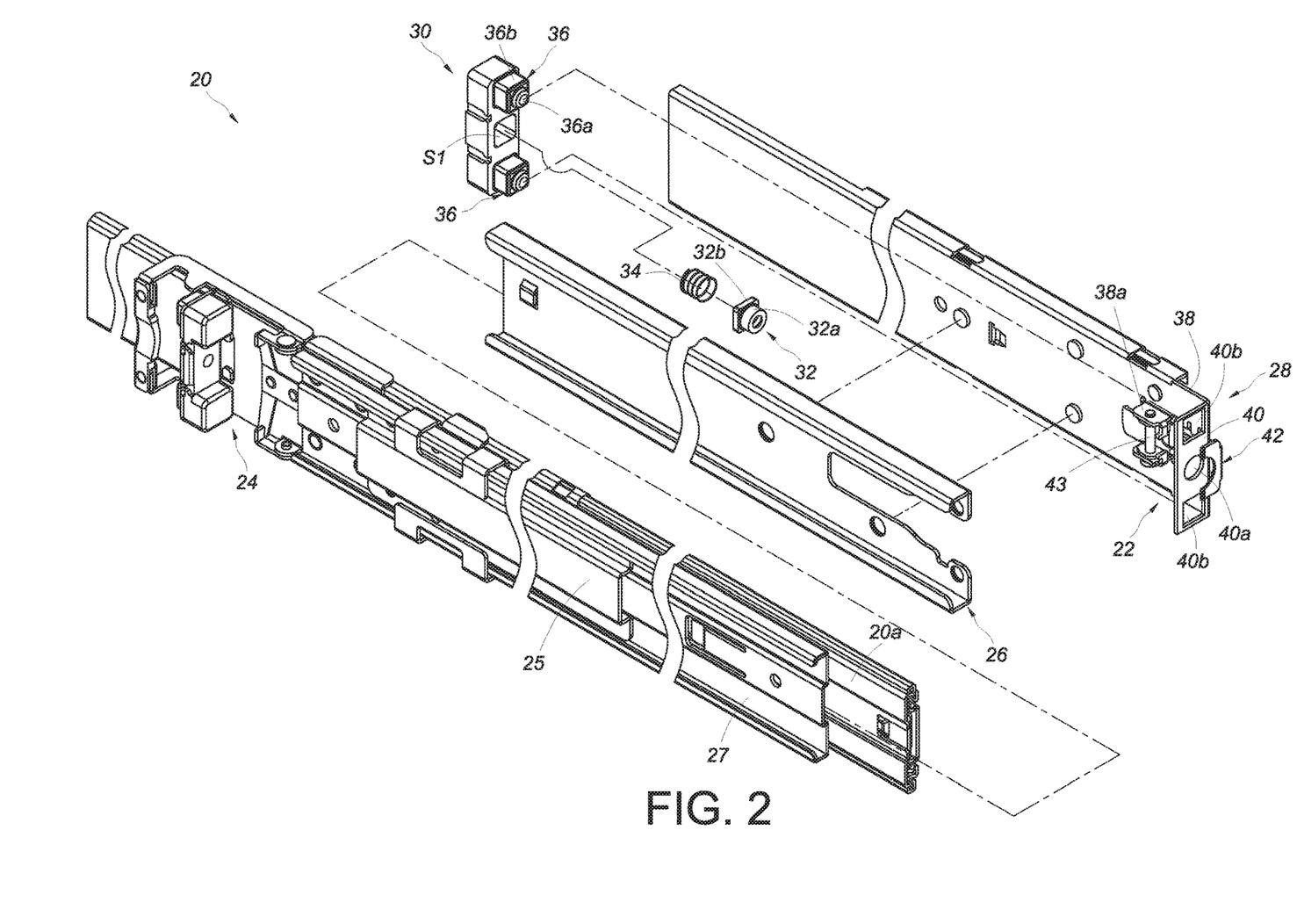
FIG. 2 is an exploded view of the slide rail assembly according to the embodiment of the present invention.

Referring to FIG. 1 and FIG. 2, a slide rail assembly 20 according to an embodiment of the present invention includes a first bracket device 22 (hereinafter referred to as the bracket device 22 for short) and a second bracket device 24. The bracket device 22 is arranged adjacent to a front portion of a slide rail 20a of the slide rail assembly 20. Here, the bracket device 22 is coupled to the front portion of the slide rail 20a via, for example but not limited to, a connecting element 26. The second bracket device 24, on the other hand, is movably mounted on a supporting base 27 on one side of the slide rail 20a via a supporting frame 25 and can be displaced with respect to the slide rail 20a to a position adjacent to a rear portion of the slide rail 20a.

The bracket device 22 includes a bracket 28, a base 30, a connecting member 32, a first elastic member 34, and preferably also a mounting member 36.

The bracket 28 includes a longitudinal wall 38 and preferably also an end wall 40 bent with respect to the longitudinal wall 38. Here, the end wall 40 is substantially perpendicularly connected to the longitudinal wall 38 by way of example. Preferably, the end wall 40 has a first hole 40a and a second hole 40b. Preferably, the bracket device 22 further includes a fastening member 42, which is pivotally connected to a lug 38a on the longitudinal wall 38 via a shaft 43. Preferably, there are two second holes 40b, both provided adjacent to the first hole 40a but one lying above the first hole 40a and the other below the first hole 40a.

Figure 3:
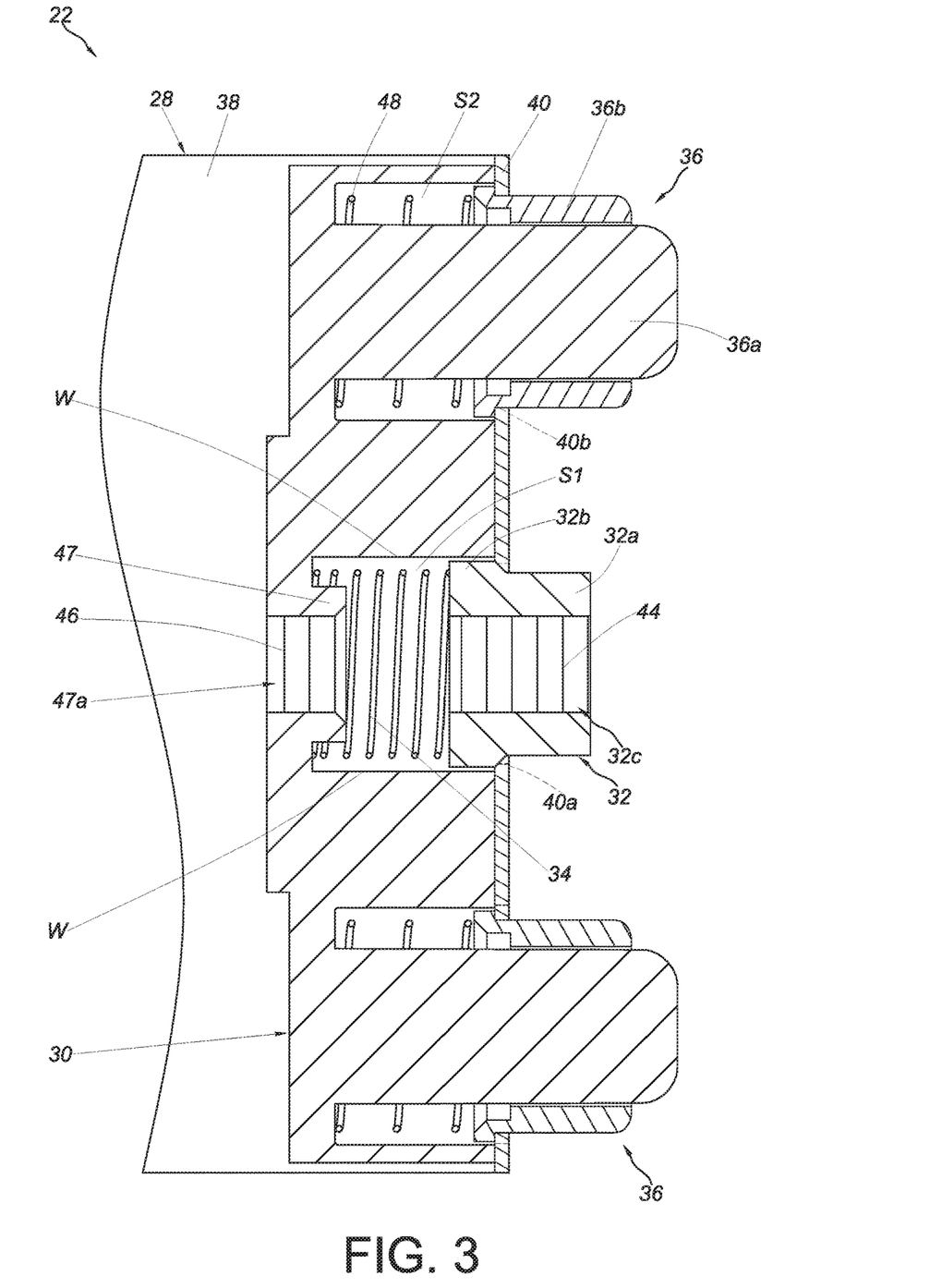
FIG. 3 is a schematic view of a bracket device according to the embodiment of the present invention.

As shown in FIG. 3, the base 30 is arranged adjacent to the longitudinal wall 38. For example, the base 30 may be connected to a lateral side of the longitudinal wall 38 or, as in this embodiment, arranged on the end wall 40. The base 30 includes a first space S1 and preferably also a second space S2.

The connecting member 32 in FIG. 3 is mounted in the first space S1 and has a portion jutting out of the first hole 40a of the end wall 40. The connecting member 32 includes a screw thread feature 44. For example, the connecting member 32 is a columnar threaded base. More specifically, the connecting member 32 includes a first portion 32a, a second portion 32b, and a through hole 32c extending through the first portion 32a and the second portion 32b. At least one of the first portion 32a and the second portion 32b includes the screw thread feature 44. Here, each of the first portion 32a and the second portion 32b includes the screw thread feature 44 by way of example. Preferably, the screw thread feature 44 of each of the first portion 32a and the second portion 32b is in the through hole 32c, e.g., on the wall of the through hole 32c. Preferably, the second portion 32b is connected to the first portion 32a, is in the first space S1, and is larger in size than the first portion 32a. Preferably, the second portion 32b has a non-circular contour (such as but not limited to a rectangular contour) that matches an inner wall W of the base 30 to prevent the connecting member 32 from rotation with respect to the base 30.

The first elastic member 34 is received in the first space S1 and is configured to apply an elastic force to the connecting member 32 so that a portion of the connecting member 32 can be kept jutting out of the first space S1. Preferably, the first elastic member 34 is pressed against the second portion 32b of the connecting member 32 such that the first portion 32a juts out of the first space S1 and the first hole 40a of the end wall 40. In other words, the elastic force of the first elastic member 34 serves to push the connecting member 32 through the first hole 40a and hence through the end wall 40.

Preferably, the base 30 includes an auxiliary screw thread feature 46. Preferably, the base 30 is provided with a connecting structure 47 in the first space S1, the connecting structure 47 includes a hole 47a, and the auxiliary screw thread feature 46 is provided on the wall of the hole 47a by way of example. The hole 47a of the connecting structure 47 and the through hole 32c of the connecting member 32 lie generally on the same longitudinal axis. The first elastic member 34 is mounted on the connecting structure 47.

The mounting member 36 is mounted in the second space S2 and has a portion jutting out of the second hole 40b of the end wall 40. The mounting member 36 includes a first mounting portion 36a and a second mounting portion 36b connected to the first mounting portion 36a in a retractable manner. The second mounting portion 36b is larger in size than the first mounting portion 36a. Preferably, the first mounting portion 36a is connected to (e.g., integrally formed with) the base 30 and has a portion jutting out of the second mounting portion 36b. Preferably, a second elastic member 48 is received in the second space S2 and applies an elastic force to the second mounting portion 36b so that a portion of the second mounting portion 36b can be kept jutting out of the second space S2.

Figure 4:
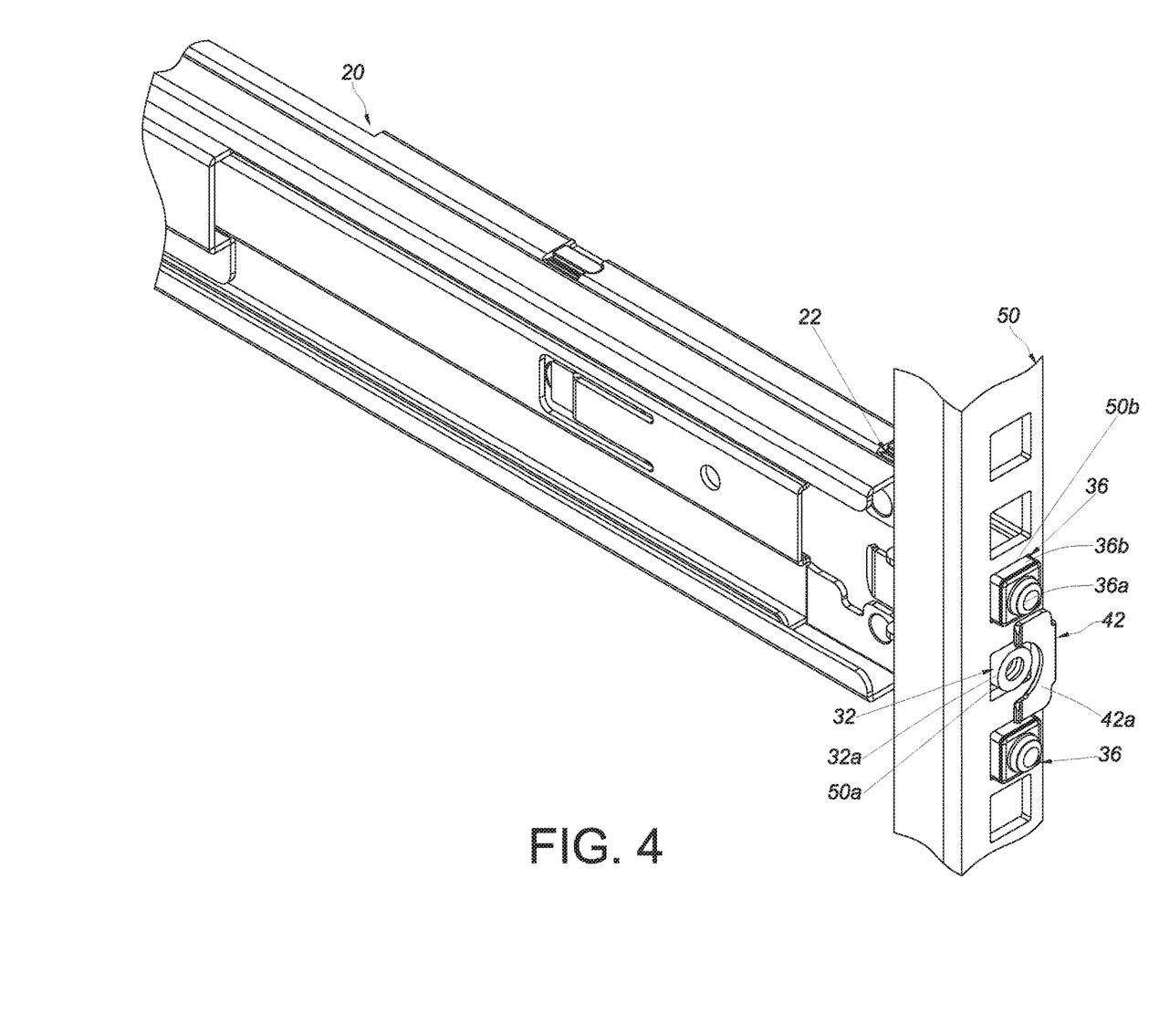
FIG. 4 is a perspective view showing how the bracket device according to the embodiment of the present invention mounts the slide rail assembly on a post.

Referring to FIG. 4, the bracket device 22 can mount the slide rail assembly 20 on a post. Here, a first post 50 is referred to by way of example. The first post 50 has a plurality of vertically arranged mounting positions, such as a first position and a second position. The first position and the second position are provided with a first mounting hole 50a and a second mounting hole 50b respectively, wherein the mounting holes are rectangular holes by way of example. The connecting member 32 is so positioned as to be mounted at the first position of the first post, e.g., with the first portion 32a of the connecting member 32 inserted in the first mounting hole 50a. On the other hand, the first mounting portion 36a and the second mounting portion 36b of the mounting member 36 are inserted in the second mounting hole 50b. It is worth mentioning that, when the fastening member 42 is at a locking position, a fastening portion 42a of the fastening member 42 is adjacent to the mounting member 36 and locked to the first post 50, thereby ensuring that the bracket device 22 is mounted on the first post 50 in a reliable manner. When the fastening member 42 is at an unlocking position instead, the fastening portion 42a of the fastening member 42 is away from the mounting member 36 and therefore no longer locked to the first post 50.

Figure 5:
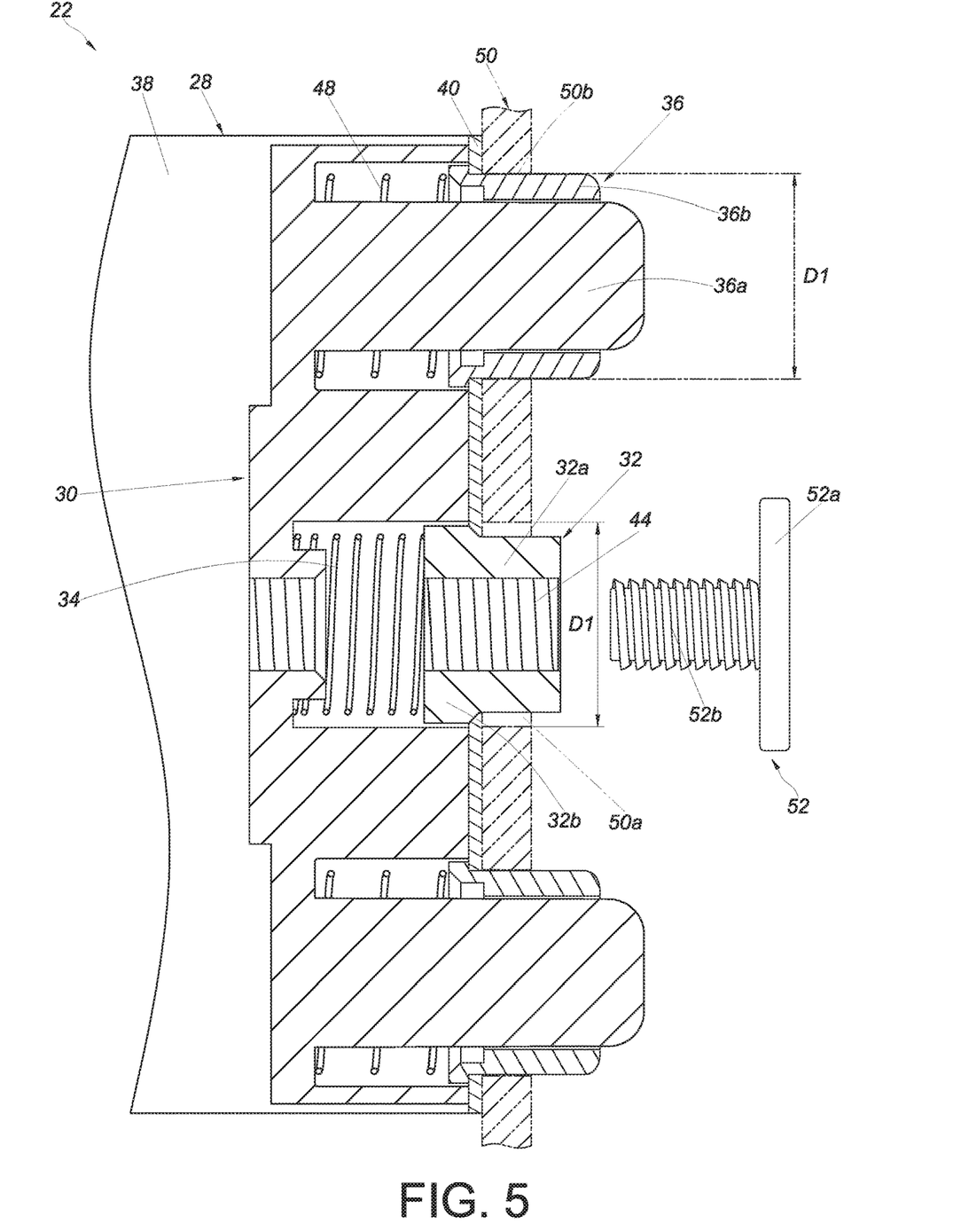
FIG. 5 is a schematic view showing that the bracket device according to the embodiment of the present invention is adapted to a first post, and that a first threaded element has yet to lock the bracket device to the first post.
Figure 6:
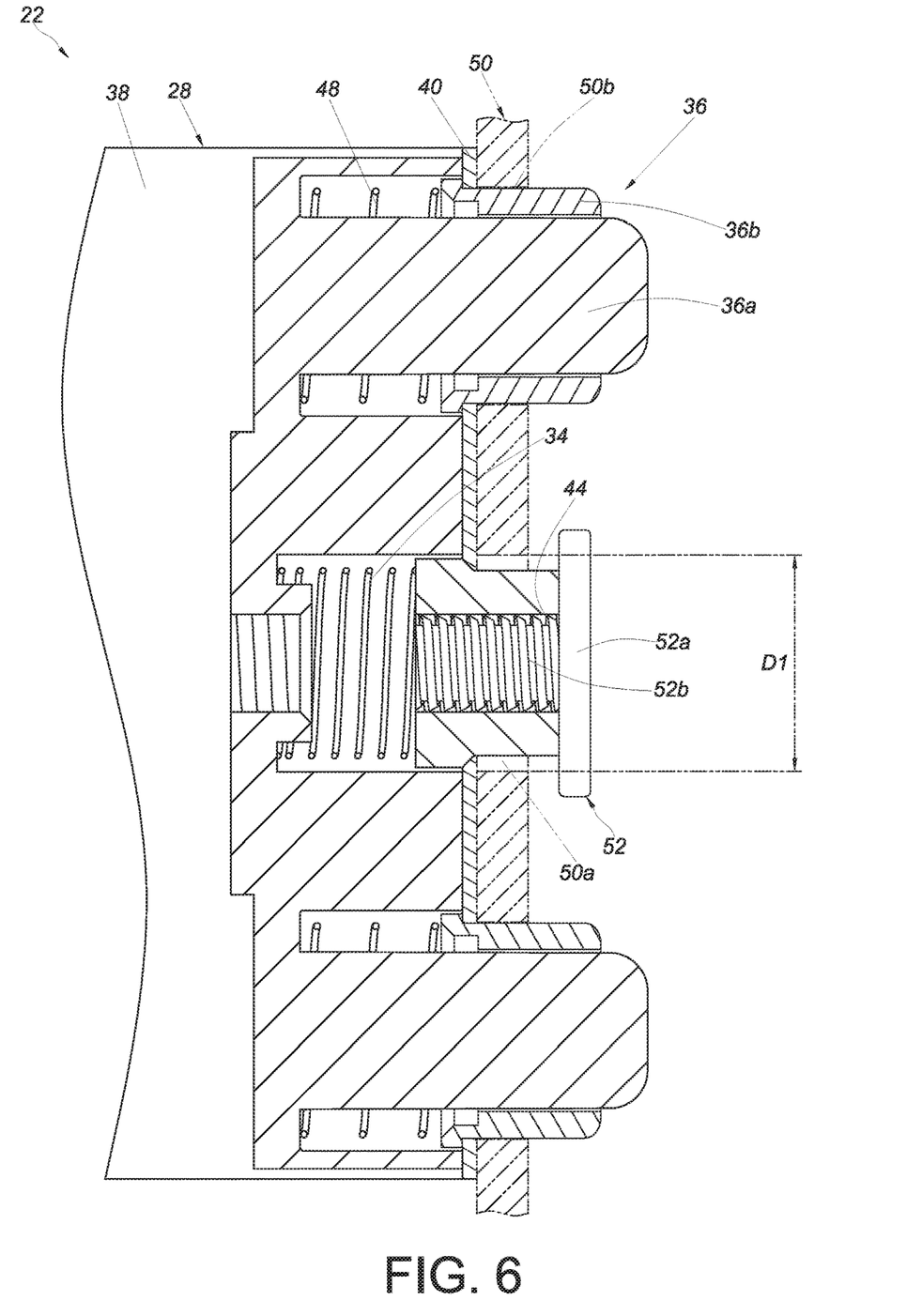
FIG. 6 is a schematic view showing that the bracket device according to the embodiment of the present invention is adapted to the first post, and that the first threaded element has locked the bracket device to the first post.

Referring to FIG. 5 and FIG. 6, the first mounting hole 50a and the second mounting hole 50b of the first post 50 have substantially the same first diameter D1 (inscribed diameter in the embodiment shown). The first diameter D1 of the first mounting hole 50a is larger than the first portion 32a of the connecting member 32, and the first diameter D1 of the second mounting hole 50b is larger than the second mounting portion 36b of the mounting member 36. This allows the first portion 32a of the connecting member 32 of the bracket device 22 to be inserted into the first mounting hole 50a of the first post 50 when the connecting member 32 corresponds in position to the first mounting hole 50a, and both the first mounting portion 36a and the second mounting portion 36b of the mounting member 36 to be inserted in the second mounting hole 50b.

A first threaded element 52 of a first set of specifications can be threadedly connected to the screw thread feature 44 of the connecting member 32 to lock the bracket 28 to the first post 50. Preferably, the first threaded element 52 includes a head 52a and a body 52b connected to the head 52a. The head 52a is larger in size than the first diameter D1 of the first mounting hole 50a. The body 52b has a screw thread feature corresponding to and threadedly connectable with the screw thread feature 44 of the connecting member 32.

Figure 7:
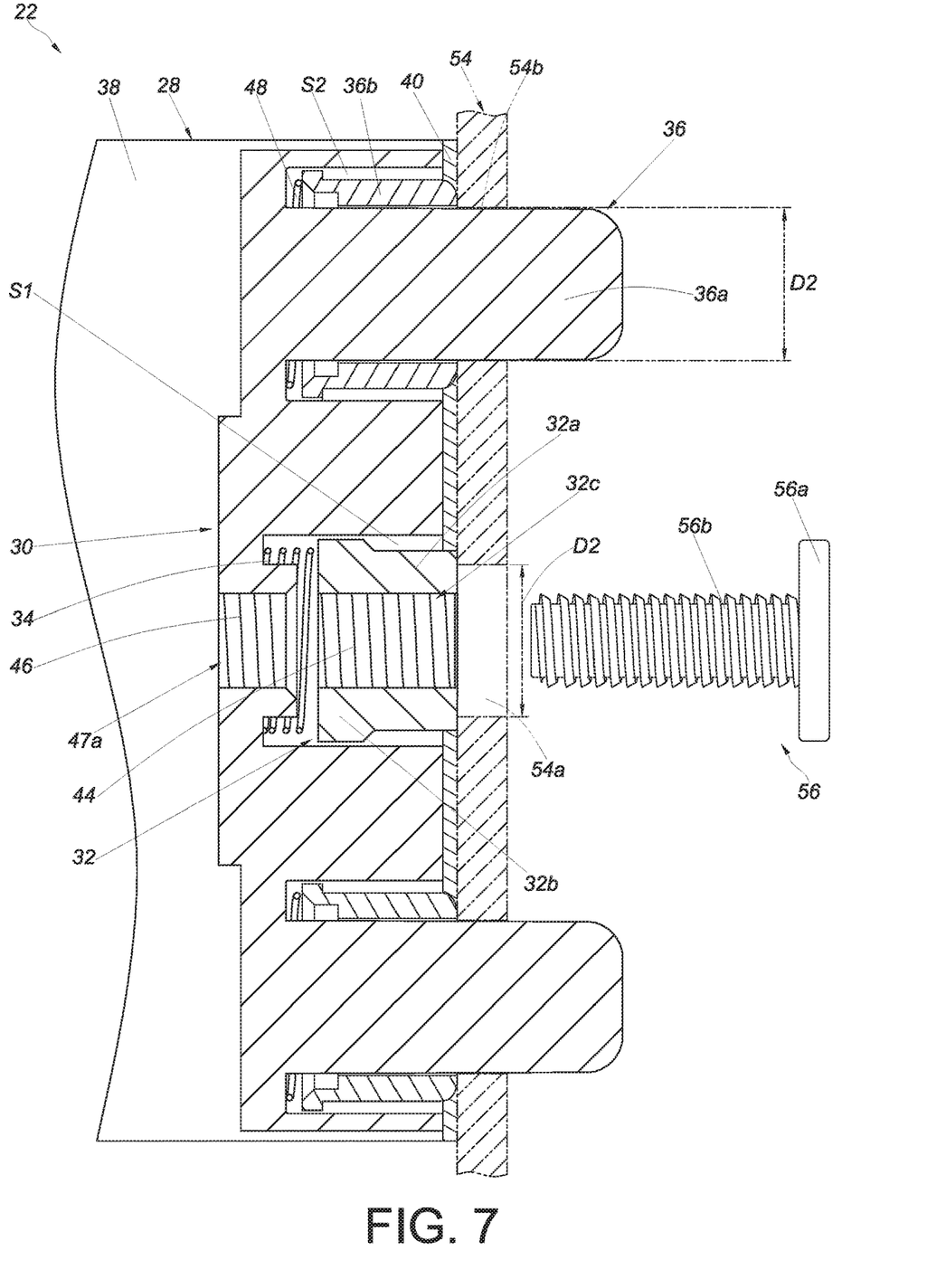
FIG. 7 is a schematic view showing that the bracket device according to the embodiment of the present invention is adapted to a second post, and that a second threaded element has yet to lock the bracket device to the second post.
Figure 8:
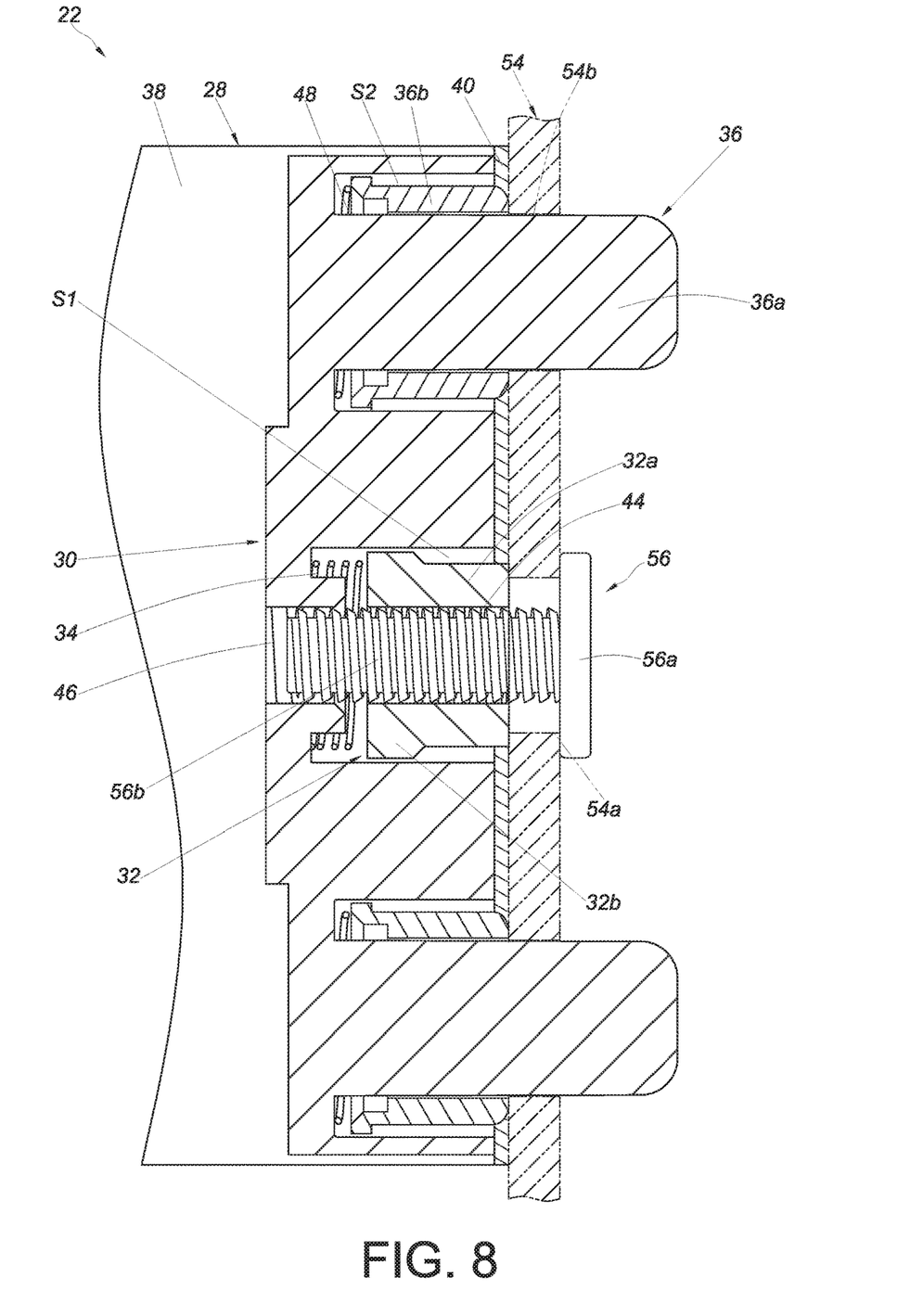
FIG. 8 is a schematic view showing that the bracket device according to the embodiment of the present invention is adapted to the second post, and that the second threaded element has locked the bracket device to the second post.

Referring to FIG. 7 and FIG. 8, the bracket device 22 can also mount the slide rail assembly 20 on a second post 54. The second post 54 has a plurality of vertically arranged mounting positions, such as a first position and a second position, which are provided with a first mounting hole 54a and a second mounting hole 54b respectively. The first mounting hole 54a and the second mounting hole 54b of the second post 54 have substantially the same second diameter D2, which is smaller than the first diameter D1 of the first post 50. The second diameter D2 of the first mounting hole 54a is smaller than the first portion 32a of the connecting member 32, and the second diameter D2 of the second mounting hole 54b is smaller than the second mounting portion 36b of the mounting member 36. Therefore, when the connecting member 32 of the bracket device 22 corresponds in position to the first mounting hole 54a of the second post 54, the first portion 32a of the connecting member 32 can be pressed against a wall portion of the second post 54 that surrounds the first mounting hole 54a, and the entire connecting member 32 will be retracted into the first space S1 as a result. On the other hand, the second mounting portion 36b of the mounting member 36 will be pressed against a wall portion of the second post 54 that surrounds the second mounting hole 54b and thus be retracted into the second space S2. As the second diameter D2 of the second mounting hole 54b is still larger than the first mounting portion 36a of the mounting member 36, the first mounting portion 36a will be inserted into the second mounting hole 54b as in the case with the first post 50. Each of the first elastic member 34 and the second elastic member 48 stores a certain amount of elastic force while in the state shown in FIG. 7 and FIG. 8.

A second threaded element 56 of a second set of specifications can be threadedly connected to the screw thread feature 44 of the connecting member 32 to lock the bracket 28 to the second post 54. Preferably, the second threaded element 56 has a head 56a and a body 56b connected to the head 56a. The head 56a is larger in size than the second diameter D2 of the first mounting hole 54a. The body 56b has a greater length than the body 52b of the first threaded element 52 and has a screw thread feature corresponding to and threadedly connectable with the screw thread feature 44 of the connecting member 32 and the auxiliary screw thread feature 46 of the base 30 to thereby lock the bracket 28 to the second post 54.

It can be known from the above that the bracket device 22 described above has preferably the following features:

1. Compared with the conventional nut for use with a slide rail bracket, the connecting member 32 disclosed herein has a simpler structure that includes the first portion 32a, the second portion 32b, and the through hole 32c, which extends through the first portion 32a and the second portion 32b. With the through hole 32c penetrating the first portion 32a and the second portion 32b, the connecting member 32 not only can be used with the first threaded element 52, but also allows the second threaded element 56, which is longer than the first threaded element 52, to pass through the through hole 32c and connect with the base 30 as well.

2. Since the first portion 32a and the second portion 32b of the connecting member 32 of the bracket device 22 are penetrated by the through hole 32c, and the first portion 32a and/or the second portion 32b is provided with the screw thread feature 44 on the wall of the through hole 32c, the screw thread feature 44 can connect with either the first threaded element 52 or the second threaded element 56 (which is longer than the first threaded element 52). In the latter case, the second threaded element 56 can further connect with the auxiliary screw thread feature 46 of the base 30 after passing through the through hole 32c.

3. The connecting member 32 can jut out of or be retracted into the first space S1, allowing the bracket device 22 to adapt to different posts.

While the present invention has been disclosed through the foregoing preferred embodiments, those embodiments are not intended to be restrictive of the scope of the invention. The scope of patent protection sought by the applicant is defined by the appended claims.

What is claimed is:

1. A bracket mounting structure, for use with a slide rail, the bracket mounting structure comprising:
    a bracket including a longitudinal wall and an end wall bent with respect to the longitudinal wall;
    a base defining a transverse surface bearing against the end wall and including a first space and a second space formed through the transverse surface, the first space formed with opposing open and closed ends, and a connecting structure formed integrally with a wall portion in one piece formation at the closed end of the first space, the connecting structure protruding towards the open end;
    a connecting member mounted in the first space proximal the open end thereof and including a first portion, a second portion, and a through hole extending through the first portion and the second portion, wherein the first portion and the second portion include a screw thread feature in the through hole, and wherein the connecting structure is formed with an auxiliary screw thread feature axially aligned with the screw thread feature;
    a first elastic member having opposing first and second ends and received in the first space and configured to apply an elastic force to the connecting member, the first end being positioned to circumscribe the connecting structure, and the second end resiliently contacting the second portion of the connecting member; and
    a mounting member disposed in the second space, the mounting member including a first mounting portion and a second mounting portion retractably connected to the first mounting portion, the first mounting portion being formed integrally in one piece formation with the base and extending coaxially through the second space.

2. The bracket mounting structure of claim 1, wherein the connecting member is so positioned as to be mounted to a post at a first position thereof, and the mounting member is configured to be inserted into the post at a second position thereof.

3. The bracket mounting structure of claim 2, wherein the post is a first post, the first position of the first post is provided with a first mounting hole corresponding to the connecting member, the second position of the first post is provided with a second mounting hole corresponding to the mounting member, and a first threaded element is able to pass through the first mounting hole and connect threadedly with the screw thread feature of the connecting member to lock the bracket to the first post.

4. The bracket mounting structure of claim 3, wherein the first mounting hole has a diameter larger than the first portion of the connecting member, the first portion of the connecting member is thereby insertable into the first mounting hole.

5. The bracket mounting structure of claim 2, wherein the post is a second post, the first position of the second post is provided with a first mounting hole corresponding to the connecting member, the second position of the second post is provided with a second mounting hole corresponding to the mounting member, and a second threaded element is able to pass through the first mounting hole and connect threadedly with the screw thread feature of the connecting member and the auxiliary screw thread feature of the connecting structure of the base to lock the bracket to the second post.

6. The bracket mounting structure of claim 5, wherein the first mounting hole has a diameter smaller than the first portion of the connecting member, the first portion of the connecting member being pressed against a wall portion of the second post that surrounds the first mounting hole, thereby retracting the entire connecting member into the first space.

7. The bracket mounting structure of claim 1, further comprising a fastening member movably mounted on the bracket, wherein when the fastening member is at a predetermined position, a fastening portion of the fastening member is adjacent to the mounting member.

8. The bracket mounting structure of claim 1, wherein the second portion is connected to and larger in size than the first portion.

9. The bracket mounting structure of claim 1, wherein the second portion has a non-circular contour.

10. The bracket mounting structure of claim 1, wherein the end wall is substantially perpendicularly connected to the longitudinal wall.

11. The bracket mounting structure of claim 1, wherein the second mounting portion is larger in size than the first mounting portion.

12. The bracket mounting structure of claim 1, wherein the first portion and the second portion are columnar.

13. A bracket mounting structure, comprising:
a bracket including a longitudinal wall and an end wall extending transversely with respect to the longitudinal wall;
a base arranged adjacent to the longitudinal wall and including a transverse surface bearing against the end wall of the bracket, the base having a first space formed through the transverse surface, and the base having a pair of second spaces formed through the transverse surface and disposed in transversely-spaced relationship with respect to the first space, wherein the first space is formed with opposing open and closed ends, wherein a connecting structure is formed integrally with a wall portion in one piece formation at the closed end of the first space, and the connecting structure protruding towards the open end;
a connecting member mounted in the first space proximal the open end thereof and including a screw thread feature;
a first elastic member having opposing first and second ends and received in the first space, the first end being positioned to circumscribe the connecting structure, and the second end resiliently contacting the connecting member;
wherein the connecting structure of the base is formed with an auxiliary screw thread feature axially aligned with the screw thread feature;
wherein the screw thread feature and the auxiliary screw thread feature are configured to connect with a threaded element; and
a pair of mounting members respectively disposed in the pair of second spaces, each mounting member including a first mounting portion and a second mounting portion retractably connected to the first mounting portion, the first mounting portion being respectively formed integrally in one piece formation with the base and extending coaxially through a corresponding second space of the pair of second spaces.

14. The bracket mounting structure of claim 13, wherein the connecting member includes a first portion, a second portion, and a through hole extending through the first portion and the second portion.

15. The bracket mounting structure of claim 14, wherein at least one of the first portion and the second portion includes the screw thread feature in the through hole.

16. The bracket mounting structure of claim 14, wherein the second portion is connected to and larger in size than the first portion.

17. The bracket mounting structure of claim 14, wherein the second portion has a non-circular contour.

18. The bracket mounting structure of claim 14, wherein the first portion and the second portion are columnar.

19. The bracket mounting structure of claim 13, wherein the end wall of the bracket is substantially perpendicularly connected to the longitudinal wall, and the connecting member extends through the end wall via a first hole of the end wall in response to an elastic force released by the first elastic member.

20. The bracket mounting structure of claim 19, wherein the second mounting portion of each mounting member of the pair of mounting members is larger in size than a corresponding first mounting portion of each mounting member of the pair of mounting members, and the first mounting portion and the second mounting portion of each mounting member of the pair of mounting members extend through the end wall via a corresponding second hole of the end wall.

* * * * *